(12) United States Patent
Kang et al.

(10) Patent No.: US 7,269,054 B2
(45) Date of Patent: Sep. 11, 2007

(54) NONVOLATILE SEMICONDUCTOR MEMORY DEVICE

(75) Inventors: Hee Bok Kang, Daejeongwangyeok-si (KR); Jin Hong Ahn, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 34 days.

(21) Appl. No.: 11/296,431

(22) Filed: Dec. 8, 2005

(65) Prior Publication Data
US 2006/0268622 A1 Nov. 30, 2006

(30) Foreign Application Priority Data
May 30, 2005 (KR) ............... 10-2005-0045480

(51) Int. Cl.
*G11C 11/00* (2006.01)
*G11C 11/34* (2006.01)
(52) U.S. Cl. .................... 365/154; 365/185.05
(58) Field of Classification Search ........ 365/154, 365/156, 230.05, 185.05
See application file for complete search history.

(56) References Cited
U.S. PATENT DOCUMENTS

| 5,390,143 | A | | 2/1995 | Manning | |
|---|---|---|---|---|---|
| 5,646,885 | A | * | 7/1997 | Matsuo et al. | 365/185.05 |
| 6,026,018 | A | | 2/2000 | Herdt et al. | |
| 6,064,590 | A | | 5/2000 | Han et al. | |
| 6,414,873 | B1 | | 7/2002 | Herdt | |
| 6,965,524 | B2 | * | 11/2005 | Choi | 365/185.08 |
| 7,110,293 | B2 | * | 9/2006 | Jung | 365/185.08 |
| 7,126,839 | B2 | | 10/2006 | Kang | 365/145 |
| 7,167,392 | B1 | * | 1/2007 | Poplevine et al. | 365/185.08 |
| 2004/0196680 | A1 | | 10/2004 | Kang | 365/49 |
| 2005/0073876 | A1 | | 4/2005 | Chen et al. | |
| 2005/0141267 | A1 | | 6/2005 | Kwon | |
| 2005/0162896 | A1 | | 7/2005 | Jung | |

FOREIGN PATENT DOCUMENTS

JP   11-205125 A   7/1999

* cited by examiner

*Primary Examiner*—Anh Phung
(74) *Attorney, Agent, or Firm*—Townsend and Townsend and Crew LLP

(57) ABSTRACT

A nonvolatile semiconductor memory device is provided for a high-powered system without the need for an additional system setting process to set the system initialization state after power-on to the previous state. The nonvolatile semiconductor memory device comprises a pull-up driving unit configured to include a plurality of nonvolatile cells for storing inputted data and to pull up a storage node, a pull-down driving unit configured to pull down the storage node, and a plurality of data registers including a data input/output unit configured to selectively input/output data between a bit line and the storage node depending on a voltage applied to a word line.

2 Claims, 11 Drawing Sheets

NONVOLATILE SEMICONDUCTOR MEMORY DEVICE

BACKGROUND OF THE INVENTION

1. Field of the Invention

The present invention generally relates to a nonvolatile semiconductor memory device comprising a nonvolatile data register, and more specifically, to a technology of a high-performance system without requiring an additional system setting process to set the initial state to be at the previous state when power is turned on.

2. Description of the Related Art

FIG. 1 is a circuit diagram illustrating a data register of a conventional SRAM. Here, a plurality of data registers are connected to form a Static Random Access Memory (hereinafter, referred to as "SRAM").

The data register of FIG. 1 comprises a pull-up driving unit 2, a pull-down driving unit 4 and a data input/output unit 6.

The pull-up driving unit 2 comprises PMOS transistors PT1 and PT2 which have gates cross-coupled with a latch structure.

The pull-down driving unit 4 comprises NMOS transistors NT1 and NT2 which have gates cross-coupled with a latch structure.

The data input/output unit 6 comprises switches NT3 and NT4 configured to selectively input and output data with bit lines BL and /BL depending on a voltage applied to a word line WL. Here, the switches NT3 and NT4 are NMOS transistors which have gates connected to the word line WL.

The operation of the above-described data register of the conventional SRAM is explained below.

In a read mode, when high level data are loaded on the true bit line BL and a driving voltage Vpp is applied to the word line WL, the switches NT3 and NT4 of the data input/output unit 4 are turned on. Here, the complement bit line /BL is set at a low level.

In the pull-up driving unit 2, the first PMOS transistor PT1 is turned on, and the second PMOS transistor PT2 is turned off.

In the pull-down driving unit 4, the first NMOS transistor NT1 is turned off, and the second NMOS transistor NT2 is turned on.

Here, when the driving voltage Vpp applied to the word line WL is intercepted, the high level data are latched by the pull-up driving unit 2 and the pull-down driving unit 4.

Meanwhile, in a read mode, when the driving voltage Vpp is applied to the word line WL, the switches NT3 and NT4 of the data input/output unit 6 are turned on.

In the case that high level data are stored, the first PMOS transistor PT1 of the pull-up driving unit 2 is turned on, so that the high level data are loaded on the true bit line BL. Here, the second NMOS transistor NT1 of the pull-down driving unit 4 is turned on to set the complement bit line /BL at a low level.

While the examples concern the case of high level data stored or read, low level data are also stored or read by the same operation as described above.

However, the conventional data register requires additional circuits and steps for a system setting process at a power-on mode.

SUMMARY OF THE INVENTION

Various embodiments of the present invention are directed at providing a high-performance system for setting an initial state to be at the previous state without an additional system setting process in a power-on mode.

According to one embodiment of the present invention, a nonvolatile semiconductor memory device comprises a plurality of data registers adapted and configured to have control terminals cross-coupled and include a plurality of nonvolatile cells, a plurality of bit lines adapted and configured to transmit data stored in the data register or to transmit externally inputted data to the data register, a plurality of sense amplifiers adapted and configured to sense and amplify data on the plurality of bit lines, and a plurality of write driving units each adapted and configured to transmit data, having an opposite polarity to the externally inputted data, into the plurality of bit lines.

According to another embodiment of the present invention, a nonvolatile semiconductor memory device is provided with a plurality of data registers. Preferably, the data register comprises a pull-up driving unit adapted and configured to include a plurality of nonvolatile cells to pull up a storage node, a pull-down driving unit adapted and configured to pull down the storage node, and a data input/output unit adapted and configured to selectively input and output data between a bit line and the storage node depending on a voltage applied to a word line.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
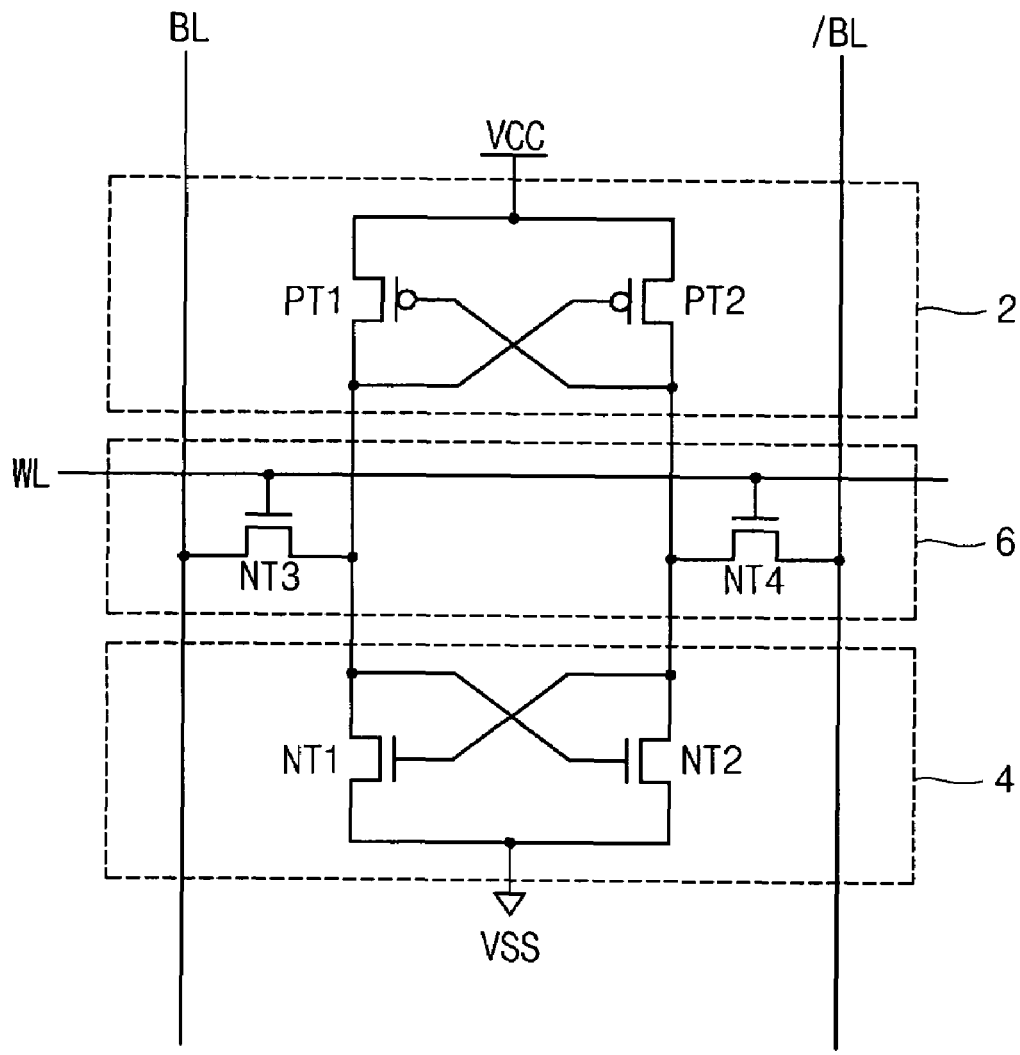
FIG. 1 is a circuit diagram illustrating a data register of a conventional SRAM.
Figure 2:
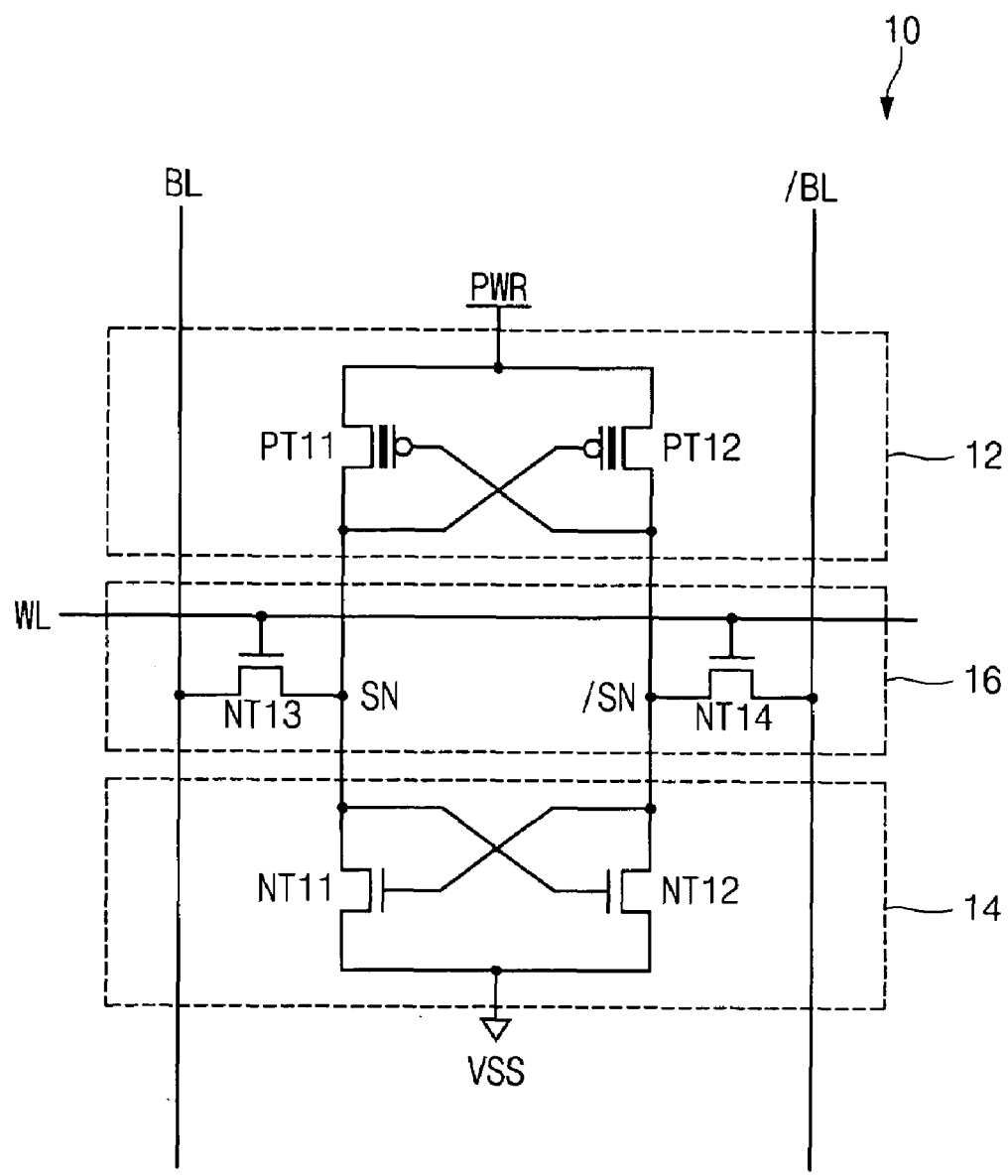
FIG. 2 is a circuit diagram illustrating a data register of a nonvolatile SRAM according to an embodiment of the present invention.

FIG. 2 is a circuit diagram illustrating a data register 10 of a nonvolatile SRAM according to an embodiment of the present invention. Here, a plurality of data registers 10 are connected to form a nonvolatile SRAM.

The data register 10 comprises a pull-up driving unit 12, a pull-down driving unit 14 and a data input/output unit 16.

The pull-up driving unit 12 comprises nonvolatile PMOS transistors PT11 and PT12 which have gates cross-coupled with input/output terminals SN and /SN. Here, the nonvolatile PMOS transistors PT11 and PT12 are nonvolatile devices.

The pull-down driving unit 14 comprises NMOS transistors NT11 and NT12 which have gates cross-coupled with the input/output terminals SN and /SN with a latch structure.

The data input/output unit 16 comprises switches NT13 and NT14 configured to selectively input and output data between bit lines BL, /BL and input/output terminals SN and /SN depending on a voltage applied to a word line WL. Here, the switches NT13 and NT14 are NMOS transistors which have gates connected to the word line WL.

Figure 3A:
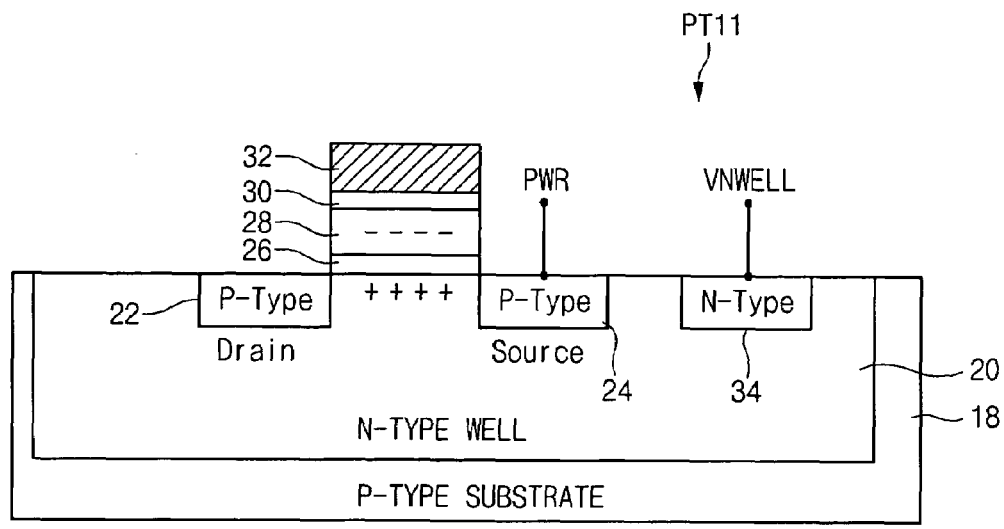
FIGS. 3*a* and 3*b* are cross-sectional diagrams illustrating a PMOS transistor of FIG. 2.
Figure 3B:
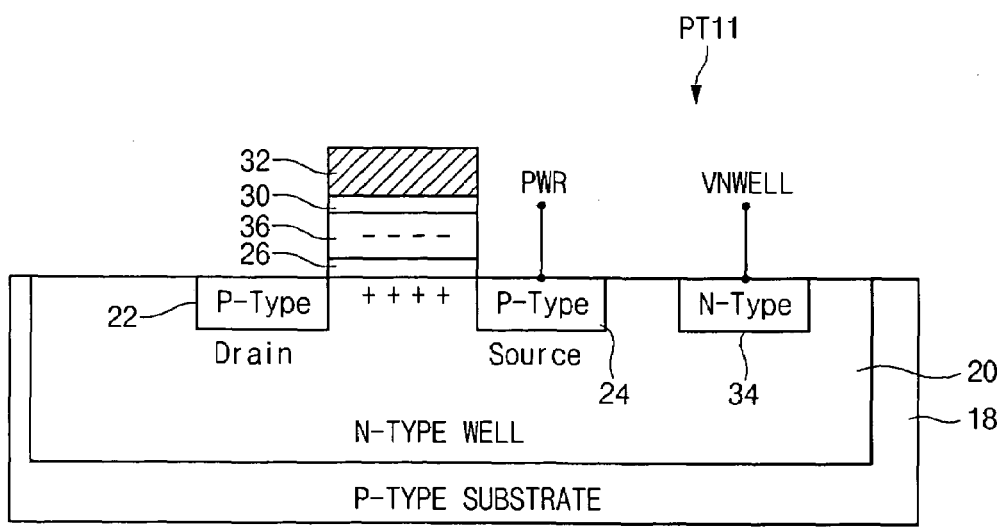

FIGS. 3a and 3b are cross-sectional diagrams illustrating the PMOS transistor PT11 of FIG. 2.

FIG. 3a is a cross-sectional diagram illustrating the PMOS transistor PT11 having a float gate.

The PMOS transistor PT11 is formed in a N-type well 20 in a P-type substrate 18. Here, a predetermined bias VNWELL is applied through a N-type terminal 34 in the N-type well region 20.

In the PMOS transistor PT11, P-type regions 22 and 24 which form a drain and source respectively, a first oxide film 26 on a channel region between the drain 22 and the source 24, a float gate 28, a second oxide film 30 and a gate 32 are sequentially formed. Here, the drain 22 is connected to the input/output terminals SN and /SN, and a power voltage PWR is applied to the source 24.

FIG. 3b is a cross-sectional diagram illustrating the PMOS transistor PT11 having a charge trap insulator.

The PMOS transistor PT11 is formed on the N-type well 20 in the P-type substrate 18. Here, a predetermined bias VNWELL is applied through the N-type terminal 34 in the N-type well region 20.

In the PMOS transistor PT11, P-type regions 22 and 24 which form a drain and source respectively, a first oxide film 26 on a channel region between the drain 22 and the source 24, a charge trap insulator 36, a second oxide film 30 and a gate 32 are sequentially formed. Here, the drain 22 is connected to the input/output terminals SN and /SN, and a power voltage PWR is applied to the source 24.

Figure 4A:
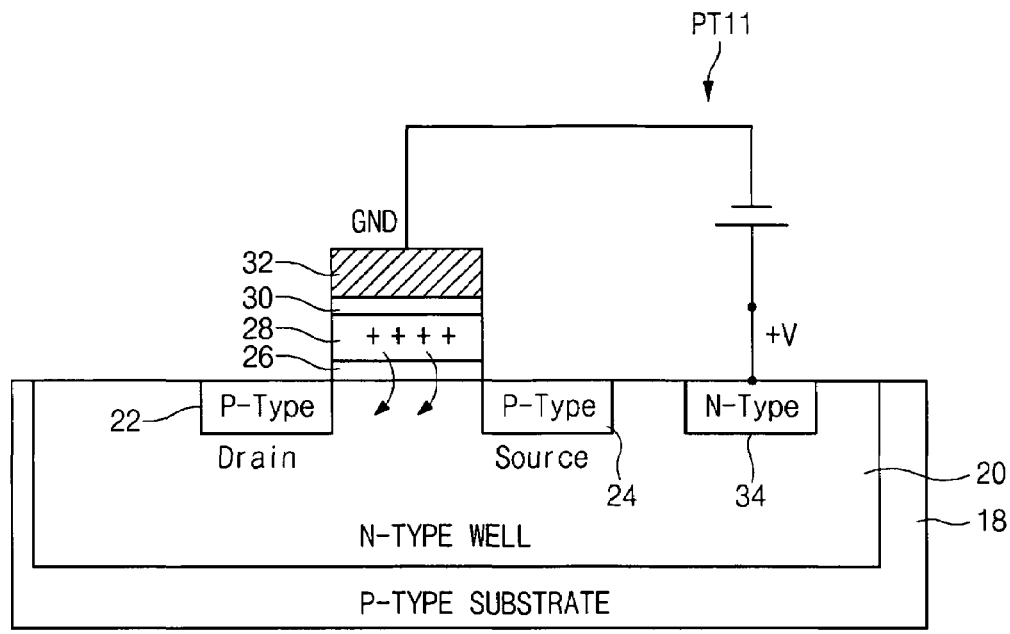
FIGS. 4*a* and 4*b* are cross-sectional diagrams illustrating an erase method of the PMOS transistor of FIG. 3*a*.
Figure 4B:
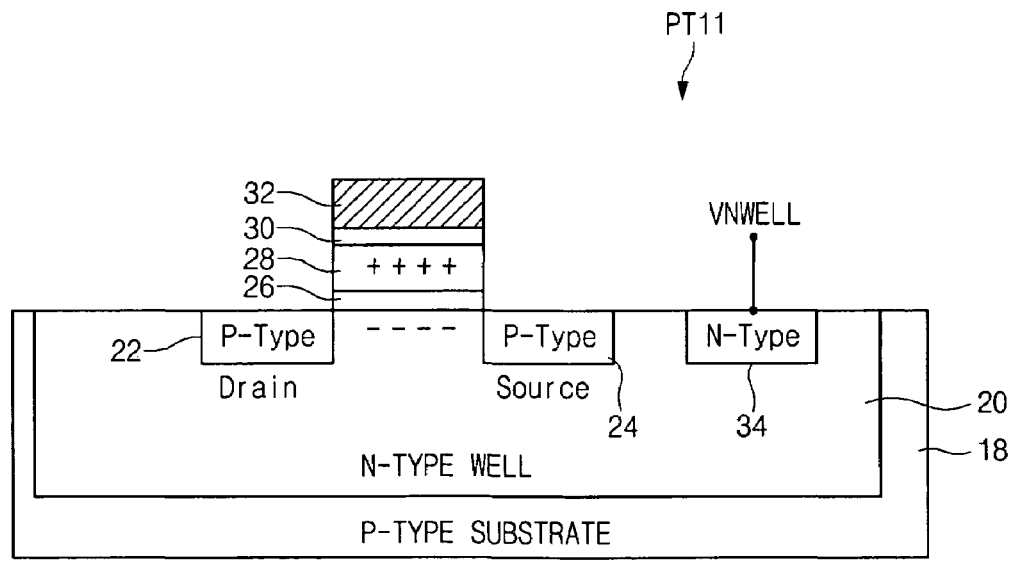

FIGS. 4a and 4b are cross-sectional diagrams illustrating an erase method of the PMOS transistor PT11 of FIG. 3a. Here, FIG. 4a is a cross-sectional diagram illustrating the erase operation and FIG. 4b is a cross-sectional diagram illustrating a state after the erase operation.

Referring to FIG. 4a, in the erase operation, a positive voltage +V is applied to the N-type well 20, and a ground voltage GND is applied to the gate 32. As a result, electrons of the float gate 28 are emitted into the channel region.

Referring to FIG. 4b, it is shown that the channel remains in the off state.

Figure 5A:
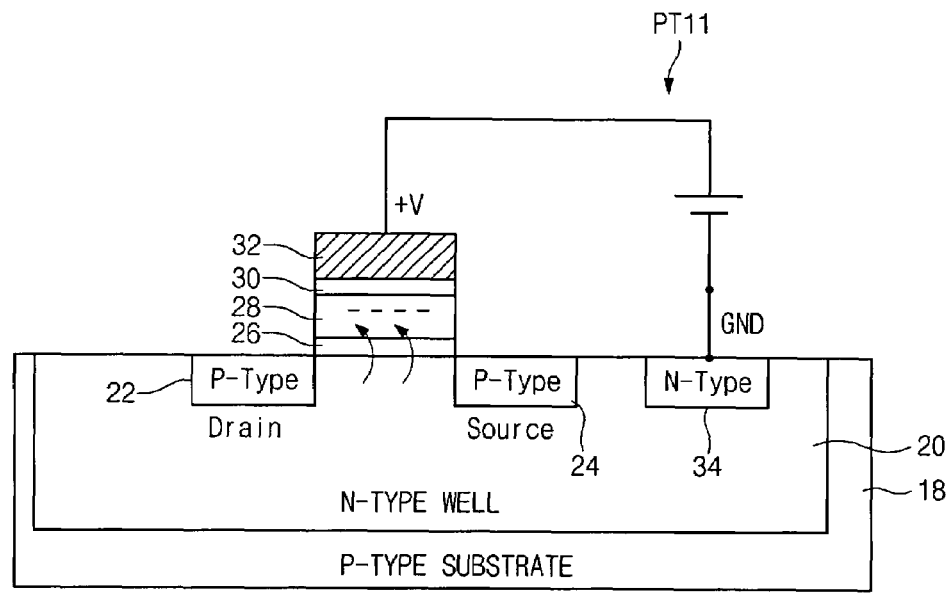
FIGS. 5*a* and 5*b* are cross-sectional diagrams illustrating a program method of the PMOS transistor of FIG. 3*a*.
Figure 5B:
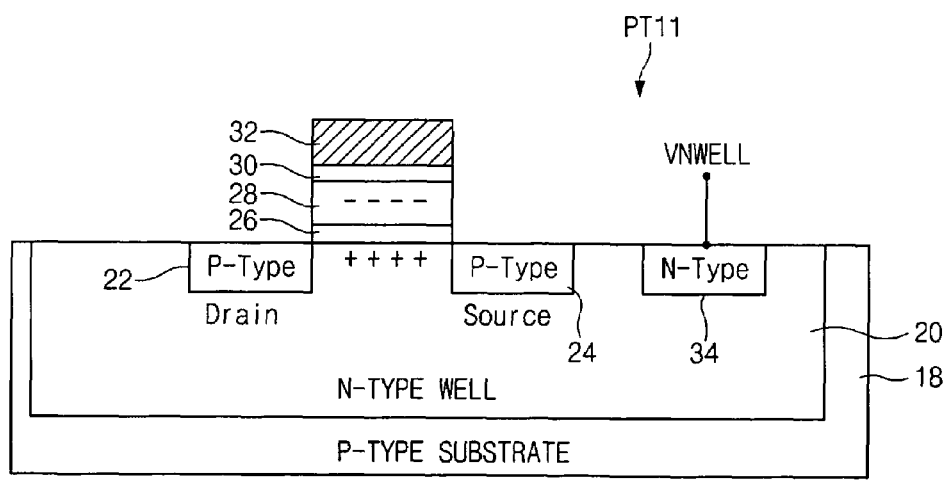

FIGS. 5a and 5b are cross-sectional diagrams illustrating a program method of the PMOS transistor PT11 of FIG. 3a. Here, FIG. 5a is a cross-sectional diagram illustrating the program operation and FIG. 5b is a cross-sectional diagram illustrating a state after the program operation.

Referring to FIG. 5a, the ground voltage GND is applied to the N-type well 20 and the positive voltage +V is applied to the gate 32. As a result, electrons of the channel region are introduced to the float gate 28.

Referring to FIG. 5b, it is shown that the channel remains in the on state.

Figure 6:
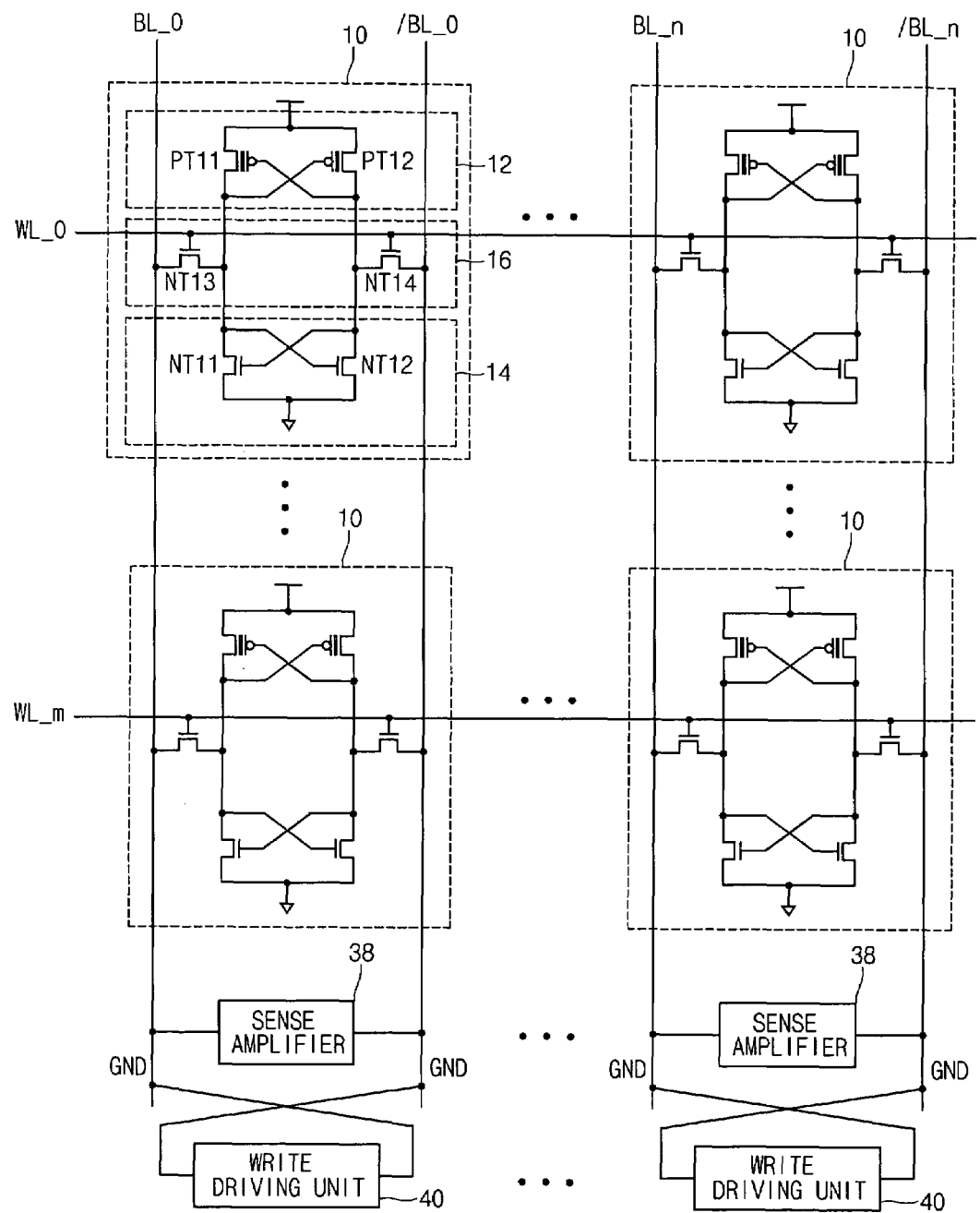
FIG. 6 is a block diagram illustrating a nonvolatile SRAM according to an embodiment of the present invention.

FIG. 6 is a block diagram illustrating a nonvolatile SRAM according to an embodiment of the present invention.

In this embodiment, the nonvolatile SRAM comprises a plurality of data registers 10, a plurality of sense amplifiers 38 and a plurality of write driving units 40.

The plurality of data registers 10 are connected to a plurality of word lines WL_0~WL_m and a plurality of bit lines BL_0, /BL_0~BL_n, /BL_n, respectively. Otherwise, the data register 10 is substantially similar to components described in reference to FIG. 2.

The plurality of sense amplifiers 38 are connected to the bit line BL_0, /BL_0~BL_n, /BL_n, respectively.

The plurality of write driving units are connected to the bit line BL_0, /BL_0~BL_n, /BL_n, respectively so that the opposite polarity to the inputted data may be inputted.

When the data having the opposite polarity to an inputted address are programmed in the data register 10, normal data are set in the data register 10 in a recall mode.

As a result, the high level data are loaded on the true bit lines BL_0~BL_n in the recall mode and the low level data are loaded on the complement bit lines /BL_0~/BL_n, so that an output signal from the sense amplifier 38 becomes 'high' and input data become the same as output data.

Figure 7:
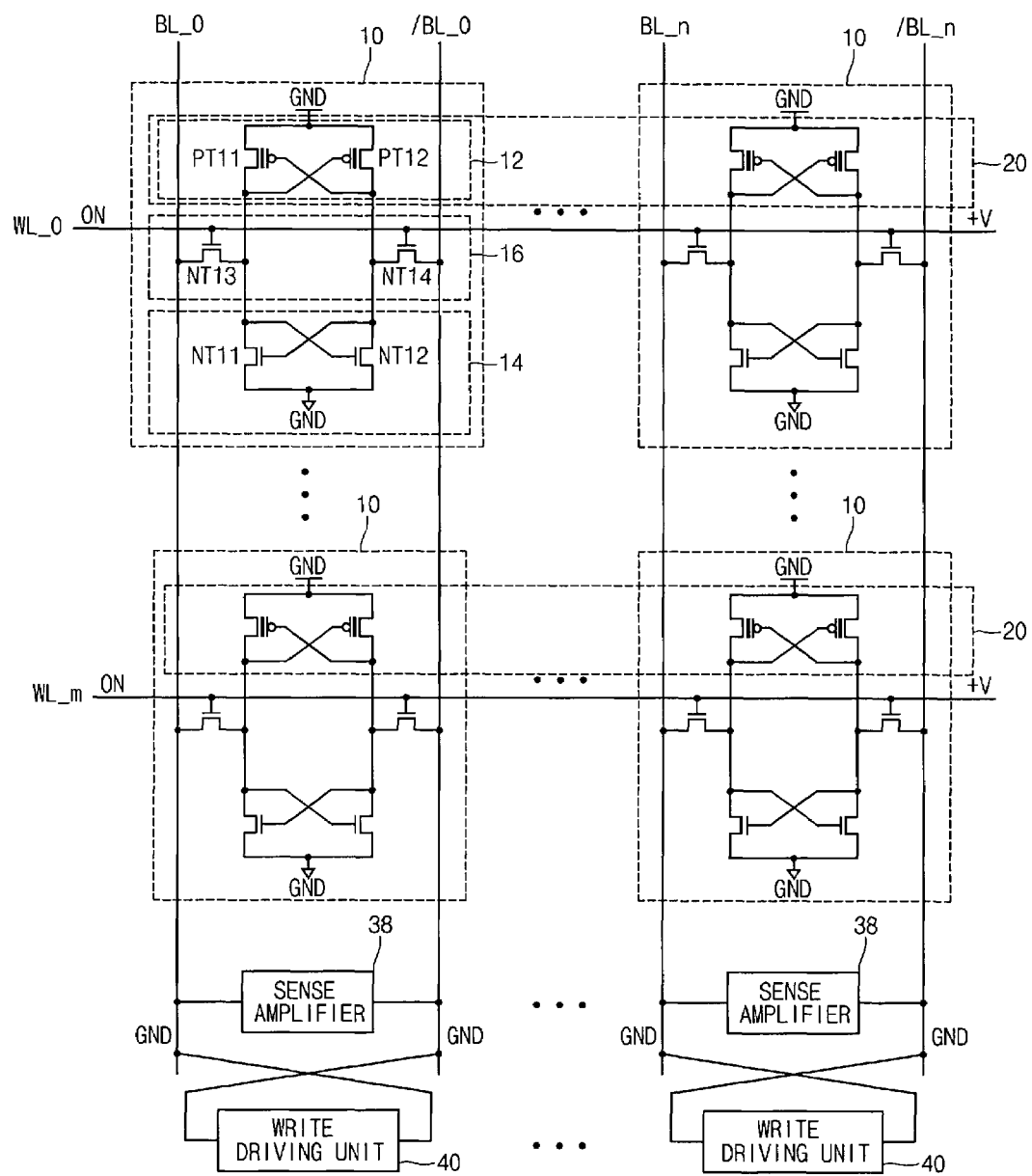
FIG. 7 is a diagram illustrating an erase method of the SRAM of FIG. 6.

FIG. 7 is a diagram illustrating an erase method of the SRAM of FIG. 6.

After all word lines WL_0~WL_m are turned on, a positive voltage +V that is an erase voltage is applied to the N-well 20, and the ground voltage GND is applied to the rest electrodes.

Figure 8:
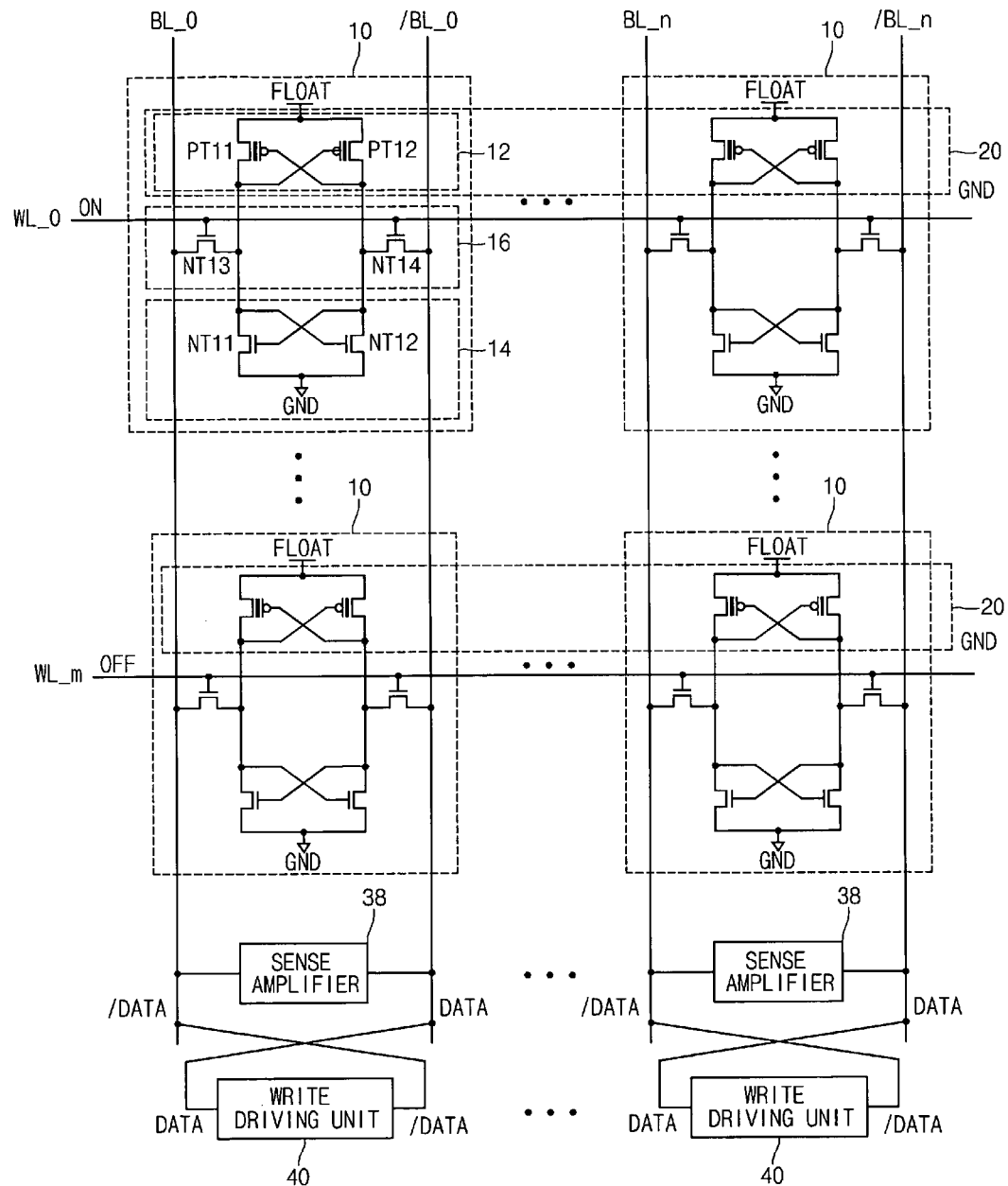
FIG. 8 is a diagram illustrating a program method of the SRAM of FIG. 6.

FIG. 8 is a diagram illustrating a program method of the SRAM of FIG. 6.

After the selected word line WL_0 is turned on, the ground voltage GND is applied to the N-well 20 of the data register 10, and the ground voltage GND and the positive voltage +V are applied to the bit lines BL, /BL respectively, so that data DATA, /DATA having an opposite polarity to each other may be applied to each cell.

Figure 9:
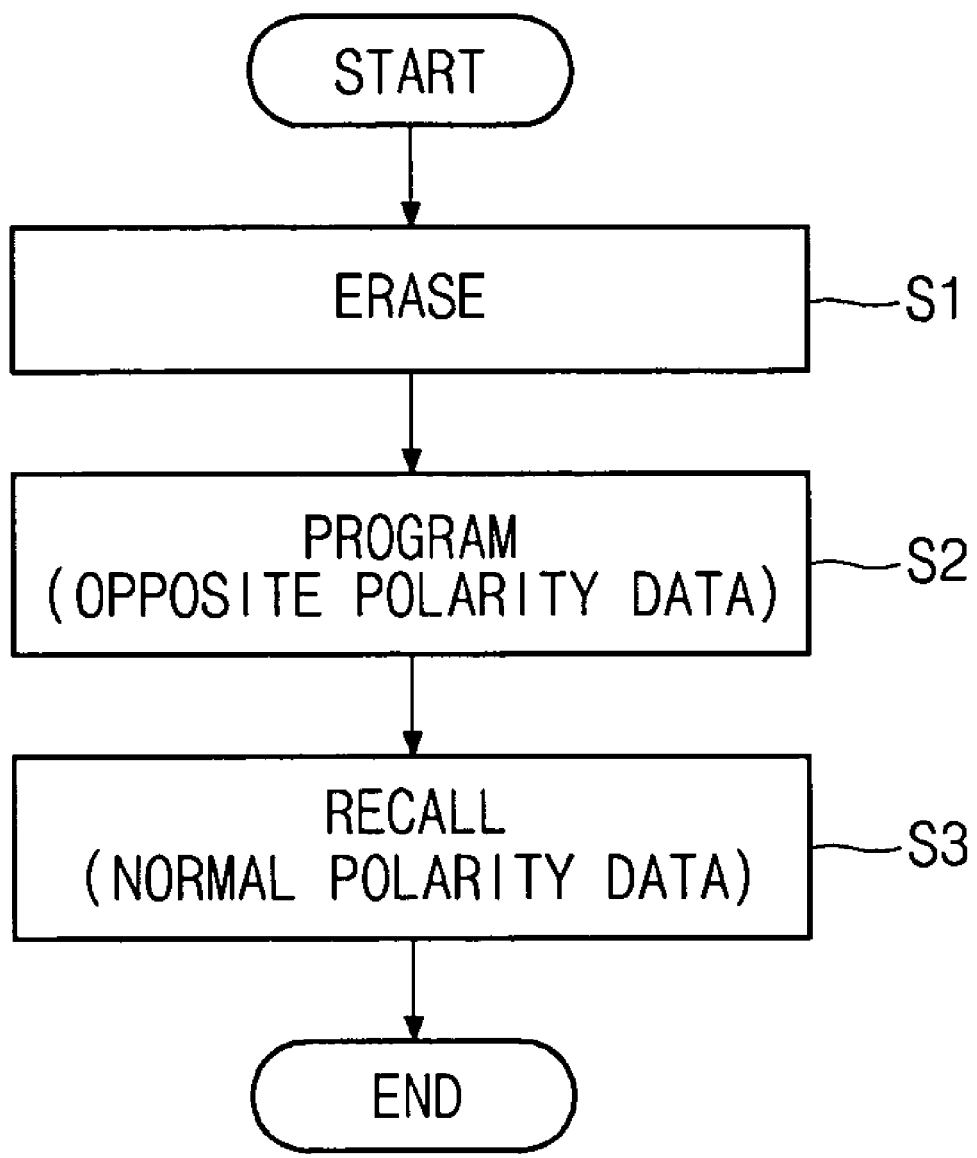
FIG. 9 is a flow chart illustrating the operation of the SRAM of FIG. 6.

FIG. 9 is a flow chart illustrating the operation of the SRAM of FIG. 6.

After all the data registers 10 are erased (S1), data having the opposite polarity are programmed to each register (S2).

After completion of the program, the recall operation is performed (S3), and data having a normal polarity of the data register 10 are restored.

Figure 10:
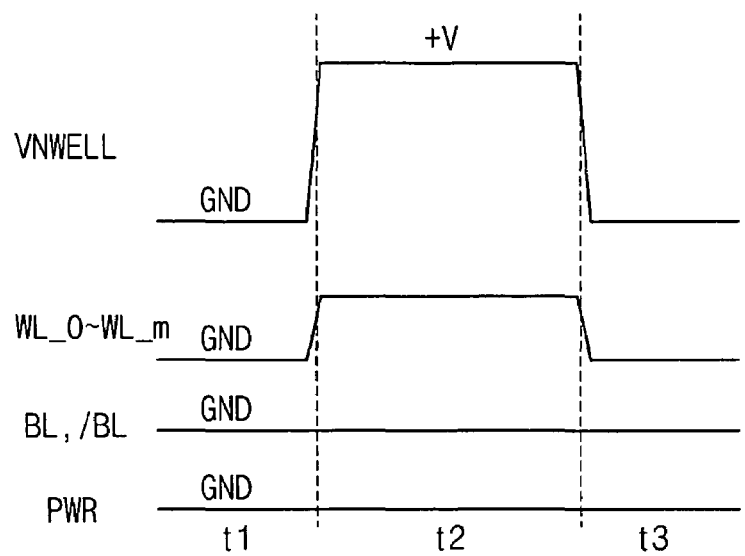
FIG. 10 is a timing diagram illustrating the erase operation of the SRAM of FIG. 6.

FIG. 10 is a timing diagram illustrating the erase operation of the SRAM of FIG. 6.

In a period t1, all application voltages are set at the ground voltage GND.

In a period t2, the positive voltage +V is applied to the N-well 20, and a selecting voltage Vs is applied to all of the word lines WL_0~WL_m to turn on the switches NT13 and NT14.

In a period t3, all of the application voltages are reset at the ground voltage GND, so that the erase operation is completed.

Figure 11:
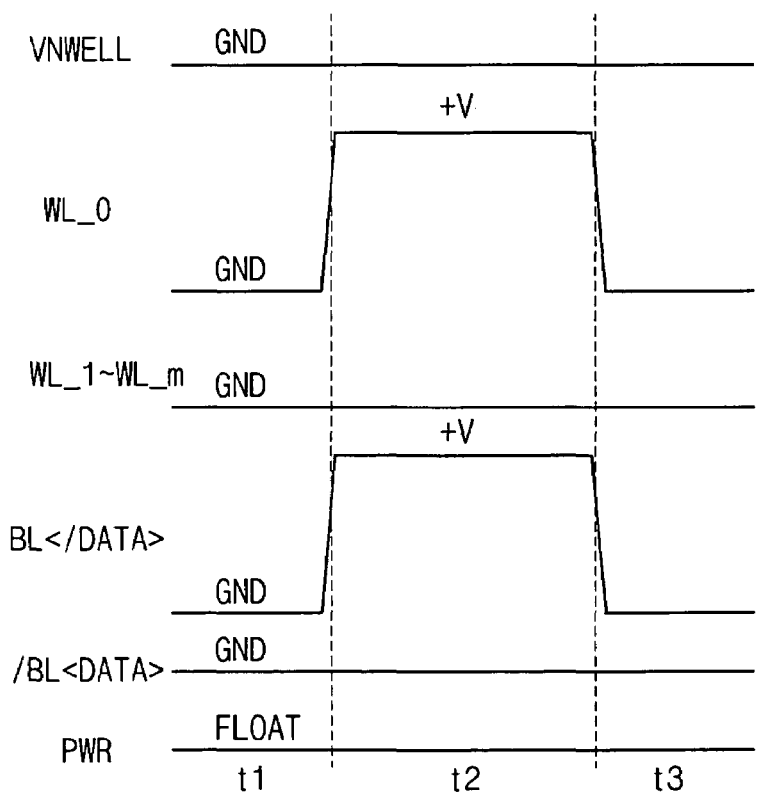
FIG. 11 is a timing diagram illustrating the program operation of the SRAM of FIG. 6.

FIG. 11 is a timing diagram illustrating the program operation of the SRAM of FIG. 6. FIG. 11 shows when the low level data DATA are programmed.

In a period t1, the power source PWR is set at the float state, and all of the application voltages except the power source PWR are set at the ground voltage GND.

In a period t2, the ground voltage GND is applied to the N-well 20, the positive voltage +V is applied to the selected word line WL_0, and the rest of the word lines WL_1~WL_m are maintained at the ground voltage GND.

The positive voltage +V corresponding to the data /DATA having the opposite polarity is applied to the true bit line BL, and the ground voltage GND corresponding to the data DATA having the normal polarity is applied to the complement bit line /BL. Here, the power source PWR is maintained at the float state.

In a period t3, the power source PWR is maintained at the float state, and all of the application voltages except the power source PWR are reset at the ground voltage GND, so that the program operation is completed.

Figure 12:
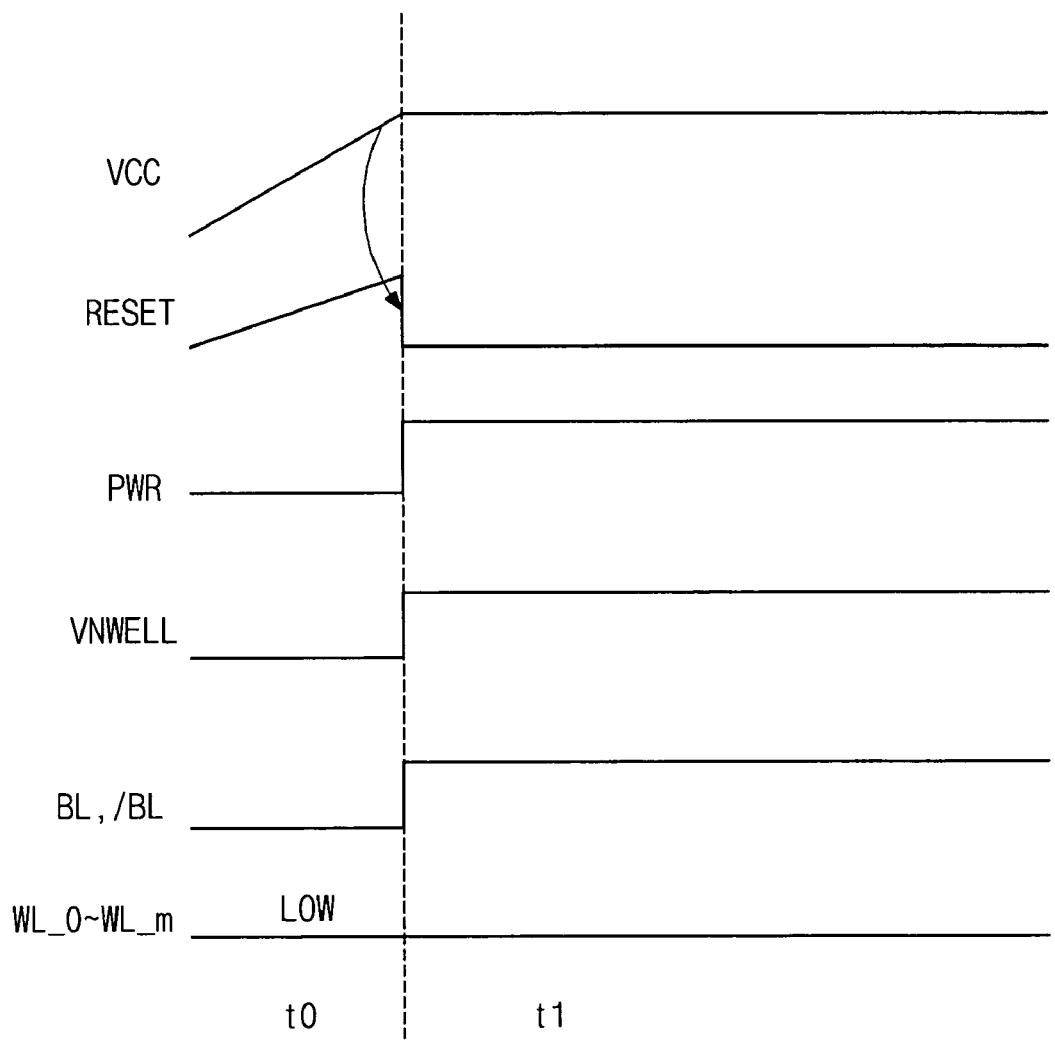
FIG. 12 is a timing diagram illustrating a recall operation at a power-on reset mode according to an embodiment of the present invention.

FIG. 12 is a timing diagram illustrating a recall operation at a power-on reset mode according to an embodiment of the present invention.

In a period t0, a power voltage VCC gradually rises in a power-on mode.

In a period t1, when the power voltage VCC sufficiently rises to generate a reset signal RESET, the power source PWR, the voltage VNWELL applied to the N-well 20 and the bit lines BL, /BL are set at the high level, and all of the word lines WL_0~WL_m are maintained at the low level, so that the state of the data register 10 is restored by the program state of the pull-up driving unit 12.

As described above, in a nonvolatile semiconductor memory device according to an embodiment of the present invention, a high-powered system can be constituted by setting the initialized system at the previous state without an additional system setting process at a power-on mode.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile semiconductor memory device comprising:
   a plurality of data registers each adapted and configured to have control terminals cross-coupled and include a plurality of nonvolatile cells;
   a plurality of bit lines adapted and configured to transmit data stored in the data register or to transmit externally inputted data to the data register;
   a plurality of sense amplifiers adapted and configured to sense and amplify data on the plurality of bit lines; and
   a plurality of write driving units each adapted and configured to transmit data having an opposite polarity to the externally inputted data into the plurality of bit lines.

2. The nonvolatile semiconductor memory device according to claim 1, wherein each of the plurality of data registers comprises:
   a pull-up driving unit including the plurality of nonvolatile cells, the pull-up driving unit adapted and configured to to pull up a storage node;
   a pull-down driving unit adapted and configured to pull down the storage node; and
   a data input/output unit adapted and configured to selectively input and output data between a corresponding one of the plurality of bit lines and the storage node depending on a voltage applied to a word line.

* * * * *